(12) United States Patent
Koike et al.

(10) Patent No.: US 8,546,834 B2
(45) Date of Patent: Oct. 1, 2013

(54) LED PACKAGE

(75) Inventors: Masayoshi Koike, Gyunggi-Do (KR);
Bum Joon Kim, Seoul (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 1116 days.

(21) Appl. No.: 11/783,788

(22) Filed: Apr. 12, 2007

(65) Prior Publication Data

US 2007/0246714 A1      Oct. 25, 2007

(30) Foreign Application Priority Data

Apr. 21, 2006   (KR) .................. 10-2006-0036373

(51) Int. Cl.
*H01L 33/00*   (2010.01)

(52) U.S. Cl.
USPC .................... 257/99; 257/E33.062

(58) Field of Classification Search
USPC ............ 257/79–100; 362/609, 612, 613, 362/623, 625, 626, 620
See application file for complete search history.

(56) References Cited

U.S. PATENT DOCUMENTS

| | | | | |
|---|---|---|---|---|
| 5,997,152 | A * | 12/1999 | Taninaka et al. | 362/249.06 |
| 6,840,654 | B2 * | 1/2005 | Guerrieri et al. | 362/241 |
| 6,917,057 | B2 * | 7/2005 | Stokes et al. | 257/98 |
| 7,250,715 | B2 * | 7/2007 | Mueller et al. | 313/485 |
| 2004/0183081 | A1 | 9/2004 | Shishov et al. | |
| 2004/0217364 | A1 * | 11/2004 | Tarsa et al. | 257/89 |
| 2005/0057145 | A1 * | 3/2005 | Shieh et al. | 313/503 |
| 2006/0214179 | A1 * | 9/2006 | Cao | 257/99 |
| 2006/0261364 | A1 * | 11/2006 | Suehiro et al. | 257/100 |

FOREIGN PATENT DOCUMENTS

| | | |
|---|---|---|
| CN | 2678144 Y | 2/2005 |
| JP | 2000-221596 | 8/2000 |
| JP | 2004-200102 | * 12/2002 |
| JP | 2004-200102 | 7/2004 |
| JP | 2006093626 | * 9/2004 |
| JP | 2005-045079 | 2/2005 |
| JP | 2005-158958 | 6/2005 |
| JP | 2006-093738 | 4/2006 |
| JP | 2006-093626 | 6/2006 |
| TW | 200511608 | 3/2005 |
| TW | I237406 | 8/2005 |
| TW | I250664 | 3/2006 |
| WO | WO 2004/102632 A2 | 11/2004 |

OTHER PUBLICATIONS

Chinese Office Action, w/ English translation thereof, issued in Patent Application No. 200710098179.9 dated on Jul. 11, 2008.
Korean Office Action, with English translation, issued in Korean Patent Application No. KR 10-2006-0036373, mailed May 23, 2007.

(Continued)

*Primary Examiner* — Matthew W Such
*Assistant Examiner* — Ali Naraghi
(74) *Attorney, Agent, or Firm* — McDermott Will & Emery LLP

(57) ABSTRACT

An LED package improved in efficiency and brightness. In the package, a body has a mounting part thereon. A plurality of light emitting diode chips are mounted on the mounting part. The mounting part has a cross-section upwardly convexed with a non-planar top portion so that at least two adjacent ones of the light emitting diode chips have opposing side surfaces facing a different direction from each other.

12 Claims, 5 Drawing Sheets

(56) References Cited

OTHER PUBLICATIONS

Japanese Office Action, w/ English translation thereof, issued in Japanese Patent Application No. JP 2007-110409 dated May 25, 2010.

Taiwanese Office Action, w/ English translation thereof, issued in Taiwanese Patent Application No. TW 096113426 dated Jun. 10, 2010.

Taiwanese Re-Examination Report, w/ English translation thereof, issued in Taiwanese Patent Application No. 96113426, dated Nov. 30, 2011.

Japanese Office Action, with English Translation, issued in Japanese Patent Application No, 2007-110409, dated Jan. 4, 2011.

* cited by examiner

LED PACKAGE

CLAIM OF PRIORITY

This application claims the benefit of Korean Patent Application No. 2006-36373 filed on Apr. 21, 2006 in the Korean Intellectual Property Office, the disclosure of which is incorporated herein by reference.

BACKGROUND OF THE INVENTION

1. Field of the Invention

The present invention relates to a light emitting diode (LED) package, more particularly, which is improved in light emitting efficiency and brightness.

2. Description of the Related Art

In general, a light emitting diode has a superior monochromic peak wavelength, and is environment-friendly and miniaturizable. This light emitting diode (LED) is packaged to be utilized as a light source of various products such as a display board, a lighting device and a light crystal display (LCD) backlight. Typically, the LED package includes an LED chip mounted on a body and a transparent resin encapsulant wrapping the LED chip. The LED chip may be of various structures, and emits a significant amount of light from its side surfaces.

The LED package may have only one LED chip thereon, but alternatively, at least two LED chips can be disposed to obtain higher brightness or desired colors. Especially, to produce white light, blue, green and red LEDs may be disposed on the LED package. The package using the LED chips of three primary colors can be employed as a backlight source of an LCD.

FIG. 1 is a cross-sectional view illustrating a conventional LED package. Referring to FIG. 1, the LED package 10 includes a body 11 having a reflector cup R formed in an upper part thereof, and LED chips 15 and 16 mounted in the body 11. The LED chips 15 and 16 may be of the same color (wavelength) or of a different wavelength. The reflector cup R has a planar bottom portion 11a, where the LED chips 15 and 16 are mounted.

As shown in FIG. 1, the LED chips 15 and 16 are mounted on the planar bottom portion 11a of the reflector cup. Therefore, opposing side surfaces of the adjacent LED chips 15 and 16 block light emitted from each other. Typically, the amount of light emitted from the side surfaces of the LED chip accounts for a considerable proportion out of the overall light amount. Thus, when the light emitted from the side surfaces of the LED chip is lost by the adjacent chip as just described, the LED package 10 is degraded in overall brightness and greatly reduced in light emitting efficiency.

SUMMARY OF THE INVENTION

The present invention has been made to solve the foregoing problems of the prior art and therefore an aspect of the present invention is to provide a high-brightness and high efficiency LED package including at least two LED chips which are disposed so as not to block light emitted from a side surface of each other.

According to an aspect of the invention, the LED package includes a body having a mounting part thereon; and a plurality of LED chips mounted on the mounting part, wherein the mounting part has a cross-section upwardly convexed with a non-planar top portion so that at least two adjacent ones of the LED chips have opposing side surfaces facing a different direction from each other.

Preferably, the body has a reflector cup formed in an upper part thereof and the mounting part is located on a bottom of the reflector cup.

The LED chips may emit light of different colors. Alternatively, the LED chips may emit light of an identical color. Preferably, the upwardly-convexed cross-section of the mounting part is a polygon. Here, the LED chips may be disposed on different mounting surfaces of the mounting part.

According to an embodiment of the invention, the upwardly-convexed cross-section of the mounting part is a polygon. The mounting part has three different mounting surfaces at the top portion thereof, and each of the LED chips is mounted on a corresponding one of the mounting surfaces.

According to another embodiment of the invention, the upwardly-convexed cross-section of the mounting part is a polygon. The mounting part has five different mounting surfaces at the top portion thereof, and each of the LED chips is mounted on a corresponding one of the mounting surfaces.

According to the invention, the LED package is adapted to output white light. For example, to produce white light, the LED chips include red, green and blue LED chips. The LED package may further include a resin encapsulant wrapping the LED chips, wherein the LED chips include blue LED chips, and the resin encapsulant has a yellow phosphor (or red or green phosphor) dispersed therein. Alternatively, the LED package further includes a resin encapsulant wrapping the LED chips, wherein the LED chips include ultraviolet LED chips, and the resin encapsulant has red, green and blue phosphors dispersed therein.

According to a preferred embodiment of the invention, each of the LED chips has a length L that is 10 times or greater than a width W thereof. Here, the LED chip is elongated, thereby significantly boosting the amount of light emitted sideward therefrom. This accordingly improves light extraction efficiency of the LED chip over a square-shaped LED chip of the same size. Preferably, the length L of the LED chip is at least 5 mm, and the width W thereof is up to 500 μm.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
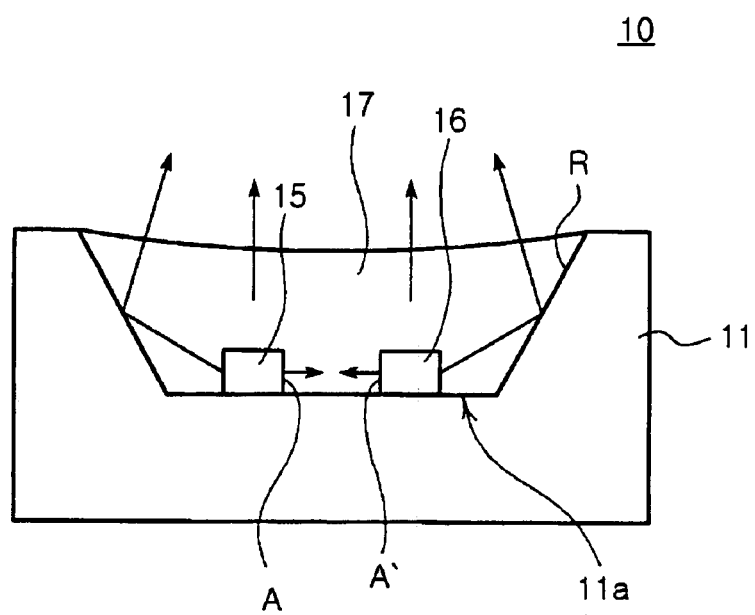
FIG. 1 is a cross-sectional view illustrating a conventional LED package.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2:
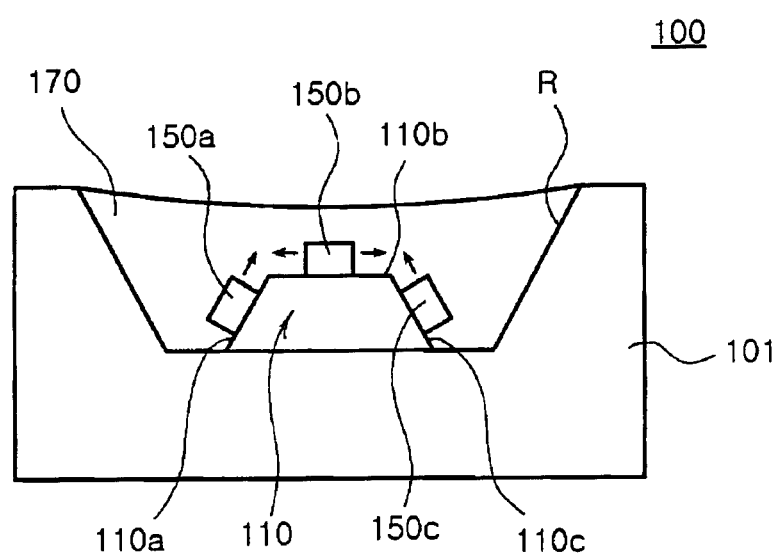
FIG. 2 is a cross-sectional view illustrating an LED package according to an embodiment of the invention.

FIG. 2 is a cross-sectional view illustrating an LED package according to an embodiment of the invention. Referring to FIG. 2, the LED package 100 includes a body 101 and a plurality of LED chips 150a, 150b and 150c mounted in the body 101. The body 101 has a reflector cup R formed in an upper part thereof so that incident light is easily reflected upward, i.e., in a light exiting direction of the package from the reflector cup R. A mounting part 110 is located on a bottom of the reflector cup R to mount the LED chips thereon. A transparent resin encapsulant 170 is formed in an area defined by the reflector cup R to wrap the LED chips 150a, 150b, and 150c.

As shown in FIG. 2, the mounting part 110 has a cross-section upwardly convexed with a non-planar top portion. Here, especially, the upwardly-convexed cross-section of the mounting part may be a polygon. Also, the mounting part 110 has three different mounting surfaces 110a, 110b, and 110c at the top portion thereof. Each of the LED chips 150a, 150b, and 150c is mounted on a corresponding one of the mounting surfaces 110a, 110b, and 110c. Accordingly, two adjacent ones of the LED chips, e.g., 150a and 150b have opposing side surfaces facing a different direction from each other. Specifically, the side surfaces of the LED chip 150a are horizontally oriented. On the other hand, the opposing side surface of the adjacent LED chip 150a or 150c is directed to the center, facing upward.

As described, the adjacent LED chips have the opposing side surfaces facing a different direction from each other so that light emitted sideward from one of the LED chips is not blocked by the other LED chip as in the prior art. This sufficiently inhibits the side-emitted light from suffering loss, thereby noticeably increasing light emitting efficiency and brightness of an overall LED package 100.

The LED chips 150a, 150b, and 150c mounted on the mounting part 110 may emit light of different colors or light of an identical color. For example, all of the LED chips may emit blue light. At least two of the same-color LED chips can be mounted on the package 100, thereby elevating brightness at a lower cost.

Alternatively, in the LED package 100, in place of the same-color LED chips, the LED chips of different colors can be utilized to output combined light, especially white light. For example, to produce white light from the LED package 100, the LED chips may include the blue LED chip, 150a, the red LED chip 150b and the green LED chip 150c. This white LED package assures the side-emitted light of the LED chips to suffer minimal loss, thereby exhibiting better brightness and efficiency. To produce white light in accordance with desired color coordinates, another LED chip in addition to the LED chips 150a, 150b, and 150c, e.g., another green LED chip may be mounted on the package 100.

Figure 3:
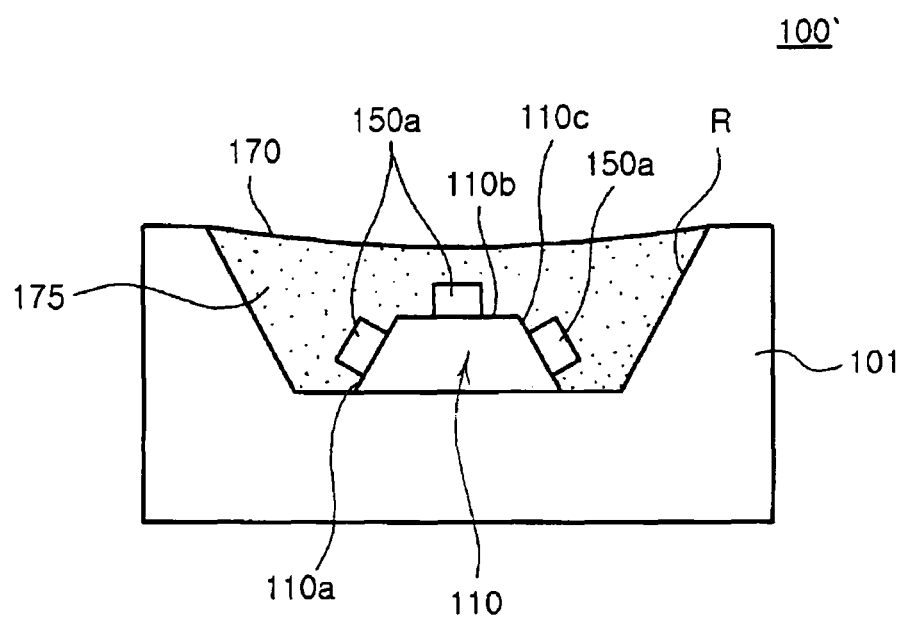
FIG. 3 is a cross-sectional view illustrating an LED package according to another embodiment of the invention.

FIG. 3 is a cross-sectional view illustrating an LED package 100' according to another embodiment of the invention. In the embodiment of FIG. 3, to produce white light, a wavelength conversion phosphor 175 is dispersed in a resin encapsulant. Referring to FIG. 3, in the same manner as in the embodiment described above, a mounting part 110 has a non-planar top portion. The mounting part 110 has three different mounting surfaces 110a, 110b, and 110c at the top portion thereof. Blue LED chips 150a are mounted on the mounting surfaces 110a, 110b, and 110c, respectively. The resin encapsulant 170 for protecting the LED chips is dispersed with the phosphor 175 for converting light emitted from the LED chips 150a into light of other longer wavelength.

To obtain white light, the phosphor 175 may be a yellow one. That is, when blue light emitted from the blue LED chips 150a is absorbed in the phosphor 175, the phosphor 175 can emit yellow light. The blue light generated from the LED chips 150a is combined with the yellow light emitted from the phosphor 175 so that the LED package 100' can output white light.

Alternatively, the phosphor 175 may be composed of a mixture of red phosphor and green phosphors. That is, when the blue light emitted from the blue LEDs 150a is absorbed in the red and green phosphors 175, the red and green phosphors can emit red light and green light, respectively. The blue light generated from the LED chips 150a is combined with the red and green light emitted from the red and green phosphors 175 so that the LED package 100' can output white light.

Alternatively, to form white light, an ultraviolet LED and red, green and blue phosphors may be employed. That is, in place of the blue LED chips 150a, the ultraviolet ray LED chips are mounted on the mounting part 110. Also, the phosphor 175 can adopt a mixture of the red, green and blue phosphors. The ultraviolet ray emitted from the ultraviolet LED chips excites the red, green and blue phosphors into red, green and blue light, respectively. These red, green and blue light are combined together to produce white light.

In a case where proper phosphors are used as in the embodiment of FIG. 3, light emitted sideward from each of the LED chips is no longer blocked by the adjacent one of the LED chips. This consequently enhances brightness and efficiency of the overall LED package 100'. This easily produces a high-brightness and high efficiency white LED package.

Figure 4:
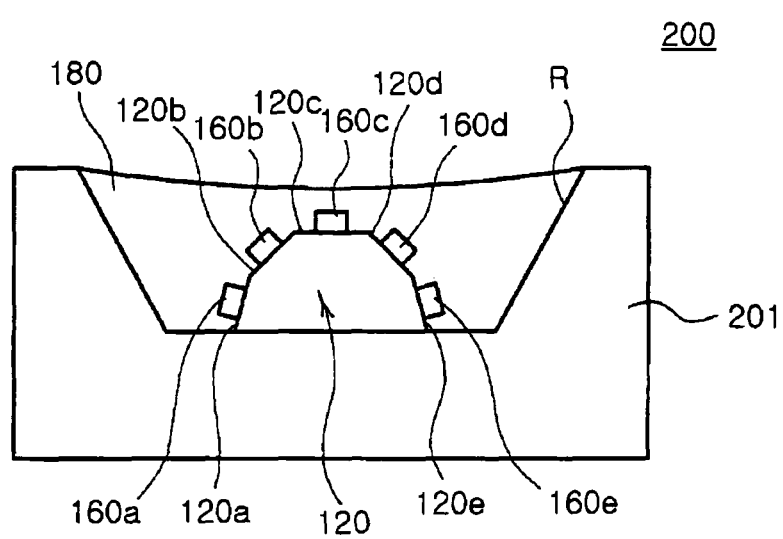
FIG. 4 is a cross-sectional view illustrating an LED package according to further another embodiment of the invention.

FIG. 4 is a cross-sectional view illustrating an LED package 200 according to another embodiment of the invention. In the embodiment of FIG. 4, a mounting part for mounting LED chips thereon has a polygonal cross-section upwardly convexed. However, in this embodiment, the mounting part has five different mounting surfaces at a top portion thereof.

Referring to FIG. 4, the LED package 200 includes a body 201 and five LED chips 160a, 160b, 160c, 160d and 160e mounted in the body 201. A mounting part 120 is located on a bottom of a reflector cup R to mount the LED chips 160a to 160e thereon. A transparent resin encapsulant 180 is formed to wrap the LED chips 160a to 160e.

As shown in FIG. 4, the mounting part 120 has a polygonal cross-section upwardly convexed with an overall non-planar top portion. Also, the mounting part 120 has five different mounting surfaces 120a, 120b, 120c, 120d, and 120e, and each of the LED chips 160a to 160e is mounted on a corresponding one of the mounting surfaces. Accordingly, adjacent ones of the LED chips have opposing side surfaces facing a different direction from each other, as indicated by reference signs 160b and 160c. This effectively inhibits light emitted sideward from each of the LED chips from suffering loss due to the adjacent one of the LED chips. This as a result improves brightness and efficiency significantly.

The LED chips 160a to 160e emit light of different colors or light of the same color. For example, to produce white light, the LED chips 160a to 160e may include a combination of the red, green and blue LED chips of three primary colors. Alternatively, to output specific color light, e.g., red light, with high brightness through the LED chips, the LED chips 160a to 160e may be of the same color, e.g., red color.

In the embodiment as described above, the mounting part 110 or 120 has a polygonal cross-section but the invention is not limited thereto. For example, the top portion of the mounting part may be upwardly convexed overall but partially rounded. According to the basic principle of the invention, the mounting part has a cross-section upwardly convexed with a non-planar top portion. This prevents the side-emitted light of the LED chips from suffering loss.

Figure 5:
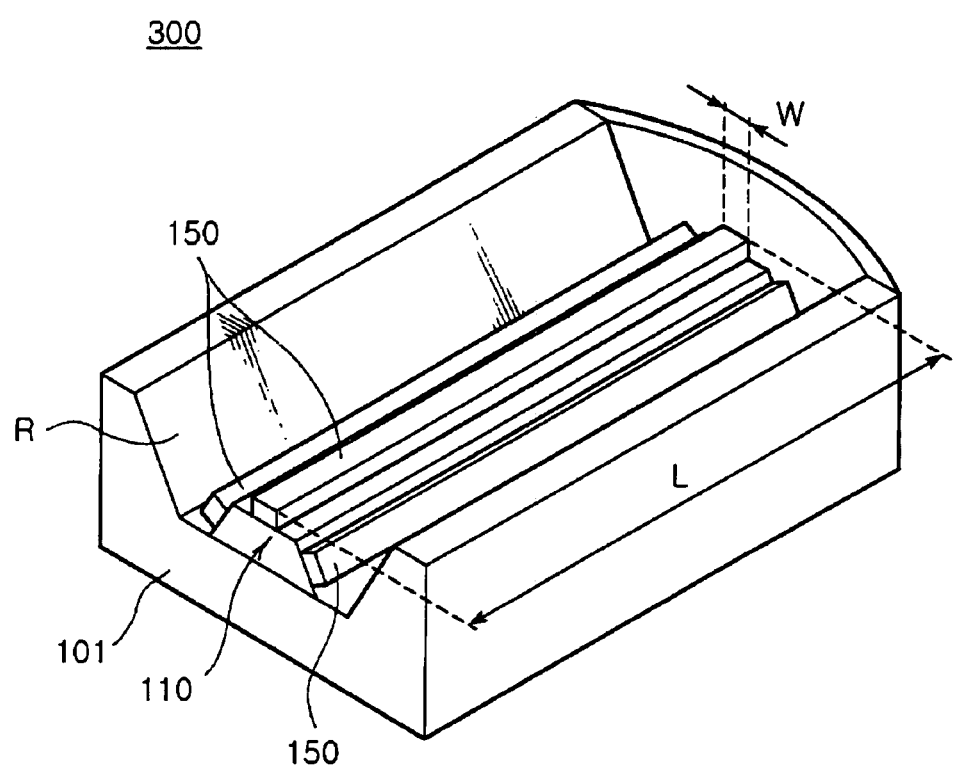
FIG. 5 is a schematic view illustrating an LED package according to further another embodiment of the invention.

FIG. 5 is a perspective view illustrating an LED package 300 according to an embodiment of the invention. In this embodiment, an LED chip itself is configured to greatly boost the amount of light emitted sideward therefrom.

Referring to FIG. 5, in the same manner as in the embodiment of FIG. 2, a mounting part 110 has a polygonal cross-sectional upwardly convexed and has three different mounting surfaces at a top portion thereof. Each of the three LED chips 150 is disposed in parallel on a corresponding one of the mounting surfaces. Here, the each LED chip 150 mounted on the mounting part 110 is elongated. Especially, the LED chip has a length L that is 10 times or greater than a width W thereof (L≥10W). The length of the LED chip refers to the length of the longest one side surface thereof, and the width of the LED chip refers to the length of the shortest side surface thereof.

As described above, the LED chip having the length L 10 times or greater than the width W thereof, is greatly improved in the amount of light emitted sideward therefrom. The amount of light emitted sideward accounts for a relatively great proportion out of an overall light amount. Therefore even though the LED chip is identical in terms of its light emitting area or length×width (L×W), a greater ratio (L/W) of the length to the width increases its light emitting efficiency and accordingly external quantum efficiency. Especially, according to the results of the test taken by the inventors, in a case where the ratio (L/W) is at least 10, the light extraction efficiency is remarkably increased over a conventional square-shaped LED chip (i.e., L=W). Preferably, the ratio (L/W) is at least 10 when the length L is at least 5 mm and the width W is up to 500 µm.

As shown in FIG. 5, the LED chips 150 are elongated and the mounting part 110 has a cross-section upwardly convexed with the non-planar top portion. This enhances light extraction efficiency of the LED chips and prevents light emitted sideward from each of the LED chips from suffering loss due to an adjacent one of the LED chips. This as a result improves light emitting efficiency and brightness of an LED package 300 more significantly.

As set forth above, according to exemplary embodiments of the invention, at least two LED chips are mounted on a mounting part having a cross-section upwardly convexed with a non-planar top portion. This effectively inhibits the side-emitted light from suffering loss. This in consequence boosts brightness and light emitting efficiency of an overall LED package.

While the present invention has been shown and described in connection with the preferred embodiments, it will be apparent to those skilled in the art that modifications and variations can be made without departing from the spirit and scope of the invention as defined by the appended claims.

What is claimed is:

1. A light emitting diode package comprising:
a body having a mounting part thereon; and
a plurality of light emitting diode chips mounted on the mounting part, wherein:
the mounting part has a cross-section upwardly convexed with a non-planar top portion so that adjacent light emitting diode chips among the plurality of light emitting diode chips have opposing side surfaces facing in different directions from one another, and
sideward light emitted from one of the light emitting diode chips is not blocked by other light emitting diode chips among the plurality of light emitting diode chips,
the body has a reflector cup formed in an upper part thereof and the mounting part is located on a bottom thereof,
the mounting part has a top mounting surface and a plurality of side mounting surfaces on the top portion thereof, and each of the light emitting diode chips is mounted on a corresponding one of the mounting surfaces,
each of the light emitting diode chips has a length that is 10 times or greater than a width thereof, and
the plurality of light emitting diode chips are disposed in parallel with a length side of the bottom of the body.

2. The light emitting diode package according to claim 1, wherein the light emitting diode chips emit light of different colors.

3. The light emitting diode package according to claim 1, wherein the light emitting diode chips emit light of an identical color.

4. The light emitting diode package according to claim 1, wherein the upwardly-convexed cross-section of the mounting part is a polygon.

5. The light emitting diode package according to claim 4, wherein the mounting part has three different mounting surfaces at the top portion thereof.

6. The light emitting diode package according to claim 4, wherein the mounting part has five different mounting surfaces at the top portion thereof.

7. The light emitting diode package according to claim 1, wherein the light emitting diode package is adapted to output white light.

8. The light emitting diode package according to claim 7, wherein the light emitting diode chips comprise red, green and blue light emitting diode chips.

9. The light emitting diode package according to claim 7, further comprising a resin encapsulant wrapping the light emitting diode chips,
wherein the light emitting diode chips comprise blue light emitting diode chips, and the resin encapsulant has a yellow phosphor dispersed therein.

10. The light emitting diode package according to claim 7, further comprising a resin encapsulant wrapping the light emitting diode chips,
wherein the light emitting diode chips comprise blue light emitting diode chips, and the resin encapsulant has red and green phosphors dispersed therein.

11. The light emitting diode package according to claim 7, further comprising a resin encapsulant wrapping the light emitting diode chips,
wherein the light emitting diode chips comprise ultraviolet light emitting diode chips, and the resin encapsulant has red, green and blue phosphors dispersed therein.

12. The light emitting diode package according to claim 1, wherein the length of the light emitting diode chip is at least 5 mm, and the width thereof is up to 500 µm.

* * * * *